United States Patent
Jeong et al.

(10) Patent No.: US 8,055,987 B2
(45) Date of Patent: Nov. 8, 2011

(54) APPARATUS AND METHOD FOR TRANSMITTING AND RECEIVING SIGNAL IN A COMMUNICATION SYSTEM

(75) Inventors: Hong-Sil Jeong, Seoul (KR); Dong-Seek Park, Yongin-si (KR); Jae-Yeol Kim, Suwon-si (KR); Sung-Eun Park, Seoul (KR); Seung-Hoon Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 916 days.

(21) Appl. No.: 12/074,890

(22) Filed: Mar. 6, 2008

(65) Prior Publication Data

US 2008/0263431 A1 Oct. 23, 2008

(30) Foreign Application Priority Data

Mar. 6, 2007 (KR) .................. 10-2007-0022112

(51) Int. Cl.
*G06F 11/00* (2006.01)
(52) U.S. Cl. ............ 714/801; 714/786; 714/790
(58) Field of Classification Search ............ 714/786, 714/790, 801
See application file for complete search history.

(56) References Cited

U.S. PATENT DOCUMENTS

| | | | |
|---|---|---|---|
| 6,789,227 B2 * | 9/2004 | De Souza et al. | 714/804 |
| 7,502,987 B2 | 3/2009 | Kyung et al. | |
| 7,549,105 B2 * | 6/2009 | Shen et al. | 714/755 |
| 7,600,173 B2 * | 10/2009 | Matsumoto | 714/755 |
| 7,729,437 B2 * | 6/2010 | Jeong et al. | 375/267 |
| 7,966,544 B2 * | 6/2011 | Paumier et al. | 714/755 |
| 7,992,066 B2 * | 8/2011 | Oh et al. | 714/752 |
| 2004/0093549 A1 * | 5/2004 | Song et al. | 714/752 |
| 2004/0221223 A1 * | 11/2004 | Yu et al. | 714/800 |
| 2005/0246615 A1 * | 11/2005 | Matsumoto | 714/801 |
| 2005/0283708 A1 * | 12/2005 | Kyung et al. | 714/758 |
| 2006/0059401 A1 | 3/2006 | Ko | |
| 2007/0022362 A1 * | 1/2007 | Yue et al. | 714/790 |
| 2008/0016433 A1 * | 1/2008 | Stolpman | 714/786 |
| 2008/0155385 A1 * | 6/2008 | Jeong et al. | 714/801 |
| 2008/0168324 A1 * | 7/2008 | Xu et al. | 714/758 |
| 2010/0211847 A1 * | 8/2010 | Livshitz et al. | 714/752 |
| 2010/0235712 A1 * | 9/2010 | Bhushan | 714/755 |

FOREIGN PATENT DOCUMENTS

| | | |
|---|---|---|
| JP | 2006-054575 | 2/2006 |
| KR | 10-2006-0047821 | 5/2006 |
| KR | 10-2006-0064989 | 6/2006 |
| KR | 10-2007-0020039 | 2/2007 |

* cited by examiner

*Primary Examiner* — Marc Duncan

(57) ABSTRACT

An apparatus and method for transmitting and receiving a signal in a communication system are provided. The signal transmission apparatus generates a parity check matrix for an LDPC code in accordance with a code rate to be used and generates a codeword vector by encoding an information vector using the parity check matrix. When the code rate is a first code rate, the signal transmission apparatus generates a first parity check matrix as the parity check matrix for the LDPC code. When the code rate is the second code rate, the signal transmission apparatus generates a second parity check matrix supporting a second code rate lower than the first code rate by adding columns of a degree of 1 and columns of a degree of 2 to the first parity check matrix and generates the second parity check matrix as the parity check matrix for the LDPC code.

24 Claims, 3 Drawing Sheets

APPARATUS AND METHOD FOR TRANSMITTING AND RECEIVING SIGNAL IN A COMMUNICATION SYSTEM

CROSS-REFERENCE TO RELATED APPLICATION(S) AND CLAIM OF PRIORITY

This application claims the benefit under 35 U.S.C. §119 (a) of a Korean Patent Application filed in the Korean Intellectual Property Office on Mar. 6, 2007 and assigned Serial No. 2007-22112, the entire disclosure of which is hereby incorporated by reference.

TECHNICAL FIELD OF THE INVENTION

The present invention generally relates to an apparatus and method for transmitting and receiving a signal in a communication system. More particularly, the present invention relates to an apparatus and method for transmitting and receiving a signal in a communication system using block Low Density Parity Check (LDPC) codes.

BACKGROUND OF THE INVENTION

A future-generation communication system has been developed to be a packet service communication system in which bursty packet data is transmitted to a plurality of mobile stations. The packet service communication system is designed especially for high-speed large-data transmission and reception. To support high-speed large-data transmission and reception in the future-generation communication system, many schemes including a Hybrid Automatic Repeat reQuest (HARQ) scheme and an Adaptive Modulation and Coding (AMC) scheme have been proposed. The use of the HARQ scheme and the AMC scheme requires support of various code rates.

Along with turbo codes, block LDPC codes are under serious consideration for the future-generation communication system due to their advantages of excellent performance gain during high-speed data transmission and increased reliability of data transmission through effective correction of noise-incurred errors in a transmission channel. However, the block LDPC code has shortcomings in code rate. In view of the nature of the block LDPC code, a codeword vector has a relatively high code rate and thus the block LDPC code is not free in terms of code rate. Most of block LDPC codes proposed so far have a code rate of 1/2 and some of them have a code rate of 1/3. This limitation of the block LDPC code in code rate makes the block LDPC code unsuitable for high-speed data transmission.

Accordingly, there is a need for a technique for transmitting and receiving a signal by supporting various code rates ranging from low to high in a communication system using block LDPC codes.

SUMMARY OF THE INVENTION

To address the above-discussed deficiencies of the prior art, it is a primary object of the present invention to address at least the problems and/or disadvantages and to provide at least the advantages described below. Accordingly, an aspect of exemplary embodiments of the present invention is to provide an apparatus and method for transmitting and receiving a signal in a communication system using block LDPC codes.

Moreover, an aspect of exemplary embodiments of the present invention provides an apparatus and method for transmitting and receiving a signal by supporting various code rates in a communication system using block LDPC codes.

In accordance with an aspect of exemplary embodiments of the present invention, there is provided a signal transmission apparatus in a communication system, in which an encoder generates a parity check matrix for an LDPC code in accordance with a code rate to be used and generates a codeword vector by encoding an information vector using the parity check matrix. When the code rate is a first code rate, the encoder generates a first parity check matrix as the parity check matrix for the LDPC code. When the code rate is a second code rate lower than the first code rate, the encoder generates a second parity check matrix supporting the second code rate by adding columns of a degree of 1 and columns of a degree of 2 to the first parity check matrix and generates the second parity check matrix as the parity check matrix for the LDPC code.

In accordance with another aspect of exemplary embodiments of the present invention, there is provided a signal reception apparatus in a communication system, in which a decoder generates a parity check matrix for an LDPC code in accordance with a code rate used in a signal transmission apparatus communicating with the signal reception apparatus and decodes a received codeword vector to an information vector using the parity check matrix. When the code rate is a first code rate, the decoder generates a first parity check matrix as the parity check matrix for the LDPC code. When the code rate is a second code rate lower than the first code rate, the decoder generates a second parity check matrix supporting the second code rate by adding columns of a degree of 1 and columns of a degree of 2 to the first parity check matrix and generates the second parity check matrix as the parity check matrix for the LDPC code.

In accordance with a further aspect of exemplary embodiments of the present invention, there is provided a method for transmitting a signal in a signal transmission apparatus of a communication system, in which a parity check matrix for an LDPC code is generated in accordance with a code rate to be used and a codeword vector is generated by encoding an information vector using the parity check matrix. Herein, when the code rate is a first code rate, a first parity check matrix is generated as the parity check matrix for the LDPC code. When the code rate is a second code rate lower than the first code rate, a second parity check matrix supporting the second code rate is generated by adding columns of a degree of 1 and columns of a degree of 2 to the first parity check matrix and the second parity check matrix is generated as the parity check matrix for the LDPC code.

In accordance with still another aspect of exemplary embodiments of the present invention, there is provide a method for receiving a signal in a signal reception apparatus of a communication system, in which a parity check matrix for an LDPC code is generated in accordance with a code rate used in a signal transmission apparatus communicating with the signal reception apparatus, and a received codeword vector is decoded to an information vector using the parity check matrix. Herein, when the code rate is a first code rate, a first parity check matrix is generated as the parity check matrix for the LDPC code. When the code rate is a second code rate lower than the first code rate, a second parity check matrix supporting the second code rate is generated by adding columns of a degree of 1 and columns of a degree of 2 to the first parity check matrix and the second parity check matrix is generated as the parity check matrix for the LDPC code.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1A:
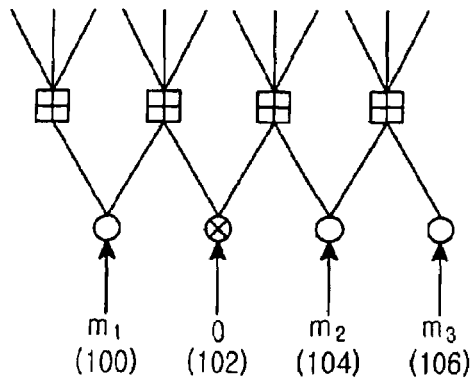
FIGS. 1A to 1D illustrate a role of nodes corresponding to bits punctured during block LDPC decoding, when puncturing is used.

FIGS. 1A through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

For a future-generation communication system, many schemes such as a Hybrid Automatic Repeat reQuest (HARQ) scheme and an Adaptive Modulation and Coding (AMC) scheme have been proposed to support high-speed large-data transmission and reception. The use of HARQ scheme and AMC scheme requires support of many code rates. As described in 2. Description of the Related Art, block Low Density Parity Check (LDPC) codes under serious consideration for use in the future-generation communication system have limitations in code rate. In this context, exemplary embodiments of the present invention provide an apparatus and method for transmitting and receiving signals by supporting various code rates in a communication system using block LDPC codes.

The design of a block LDPC code involves the design of a parity check matrix. To support a variety of code rates using a single Coder-Decoder (CODEC) in the communication system using block LDPC codes, a single parity check matrix should be designed so as to support the code rates. A major scheme that supports two or more code rates by use of a single parity check matrix is puncturing.

The puncturing scheme transmits only part of a codeword vector generated from an encoder, thus increasing a code rate. That is, part of a codeword vector is punctured and the rest of the codeword is transmitted. Assuming that the codeword vector includes an information vector and a parity vector and the parity vector includes at least one parity bit, the punctured part of the codeword vector exists usually in the parity vector. If the information vector is punctured, it may occur that there is no information vector input to a decoder and thus normal decoding is impossible. That's why the parity vector is punctured. On the other hand, when a small number of information bits corresponding to columns of a high-degree parity check matrix are punctured, normal decoding is possible through iterative decoding despite the puncturing of the information vector and as many parity bits can be generated for the parity vector. Hence, decoding performance is increased.

A description will be made below of a parity check matrix for a (N, K)=(1720, 860) block LDPC code with a code rate of 1/2, for example.

The (1720, 860) block LDPC code is composed of an information vector and a parity vector given as:

$$c=(u_1, u_2, \ldots, u_{860}\,;p_1, p_2, \ldots, p_{860}),\qquad \text{[Eqn. 1]}$$

where c denotes the codeword vector (i.e., the (1720, 860) block LDPC code), u denotes the information vector, $u_i$ denotes an $i^{th}$ information bit of the information vector, p denotes the parity vector, $p_i$ denotes an $i^{th}$ parity bit of the parity vector.

It is assumed that the parity vector of the (1720, 860) block LDPC code is punctured, resulting in:

$$c_{punc}=(u_1, u_2, \ldots, u_{860}\,;p_1, p_3, p_5, \ldots, p_{17}, p_{430}),\qquad \text{[Eqn. 2]}$$

where $c_{punc}$ denotes the punctured codeword vector equivalent to an (N, k)=(1290, 860) block LDPC code with a code rate of 2/3.

When the above-described puncturing is performed, block LDPC decoding is carried out using the same parity check matrix as one used for decoding a non-punctured block LDPC code, since the punctured parity bits are considered erasures. In other words, Log Likelihood Ratios (LLRs) obtained from a channel for the punctured parity bits are always considered to be 0s. For example, if bits corresponding to columns of a parity check matrix with a degree of 2 are punctured in a codeword vector, nodes corresponding to the punctured bits do not affect iterative decoding-caused performance improvement or degradation during decoding. Rather, they only act as paths in which messages from other nodes are passed. In another example, if bits corresponding to columns of a parity check matrix with a degree of 1 are punctured in a codeword vector, nodes corresponding to the punctured bits simply transmit 0s. In this case, signals output from the check nodes connected to the punctured bits are 0s all the time and thus rows of the parity check matrix connected to the punctured bits can be removed.

As described above, the use of the puncturing enables a given encoder and decoder to be still used despite change of a code rate. Therefore, with the puncturing, coding complexity and decoding complexity are constant irrespective of a code rate and a codeword vector length. Another feature of the above puncturing scheme is that the code rate is changed by changing only a parity vector length.

With reference to FIGS. 1A to 1D, a role of nodes corresponding to punctured bits during block LDPC decoding in the case of the above puncturing will be described.

FIGS. 1A to 1D illustrate a role of nodes corresponding to bits punctured during block LDPC decoding, when puncturing is used.

Figure 1B:
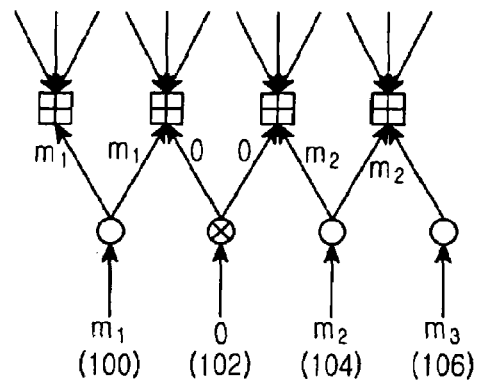
Figure 1C:
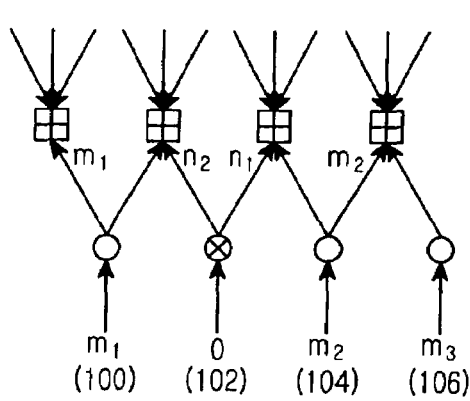
Figure 1D:
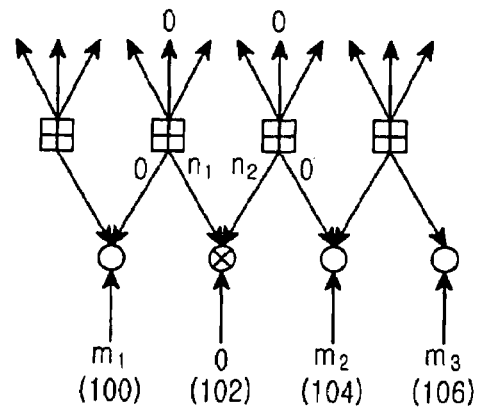

In FIGS. 1A to 1D, ⊗denotes punctured nodes and arrows indicate the directions of transferring messages. Messages incoming from a channel illustrated in FIG. 1A are provided to check nodes during a first decoding as illustrated in FIG. 1B. Outgoing messages from the check nodes to all nodes connected to the punctured nodes are 0s as illustrated in FIG. 1C. Outgoing messages from the check nodes to the punctured nodes are not 0s, which are passed in respective paths without affecting one another as illustrated in FIG. 1D. A subsequent decoding operation is performed in a conventional block LDPC decoding manner. The punctured nodes act just as paths for passing messages without affecting decoding performance.

If bits corresponding to columns of a parity check matrix with a degree of 2 are punctured, nodes corresponding to the punctured bits do not affect iterative decoding-caused performance improvement or degradation during decoding. The punctured nodes simply function to pass messages incoming from other nodes.

If bits corresponding to columns of a parity check matrix with a degree of 1 are punctured, variable nodes corresponding to the punctured bits simply transfer 0s during decoding. Since the outputs of check nodes connected to the variable nodes are 0s all the time, the check nodes can be removed. Therefore, it is possible to delete columns corresponding to the variable nodes and rows corresponding to the check nodes in the parity check matrix.

As illustrated in FIG. 1, when three variable nodes with a degree of 2 and one variable node with a degree of 1 are connected to four check nodes and bits corresponding to all variable nodes 100, 102, 104 and 106 are punctured, all the four check nodes can be removed. The resulting effect amounts to removing columns corresponding to the variable nodes with a degree of 2, the variable node with a degree of 1, and the check nodes connected to the variable nodes. Since the variable nodes and check nodes corresponding to the removed columns and rows are not used for encoding and decoding, encoding and decoding complexity is reduced. Also, the degree distribution of a parity check matrix for a block LDPC code with a relatively high code rate is easily optimized.

As described above, a single parity check matrix should accommodate a variety of code rates in order to support the code rates using a single CODEC in a communication system using block LDPC codes. Hence, the present invention provides a technique for supporting a variety of code rates using a first parity check matrix, namely a child parity check matrix and a parent parity check matrix derived from the child parity check matrix. While it is described herein for convenience' sake that the parent parity check matrix is generated based on the child parity check matrix, they can be generated independently. The child parity check matrix is for a block LDPC code with a relatively high code rate, R1 and the parent parity check matrix is for a block LDPC code with a relatively low code rate R2, generated by concatenating columns with a degree of 2 and columns with a degree of 1 based on the child parity check matrix. It is also assumed that the child and parent parity check matrices each include an information part corresponding to an information vector and a parity part corresponding to a parity vector.

Now a description will be made of block LDPC parity check matrices for supporting a variety of code rates according to exemplary embodiments of the present invention.

The parent parity check matrix, i.e., the parity check matrix for the block LDPC code with R2 is:

$$\begin{bmatrix} H_1 & H_{p11} & 0 & 0 \\ H_2 & H_{p21} & H_{p2} & 0 \\ H_3 & H_{p31} & H_{p32} & H_{p3} \end{bmatrix}. \quad \text{[Eqn. 3]}$$

The parent parity check matrix includes a plurality of partial matrices, $H_1$, $H_2$, $H_3$, $H_{p11}$, $H_{p21}$, $H_{p31}$, 0, $H_{p2}$, $H_{p32}$, 0, 0, and $H_{p3}$. The partial matrices $H_1$, $H_2$ and $H_3$ correspond to the information part of the parent parity check matrix, and the remaining partial matrices $H_{p11}$, $H_{p21}$, $H_{p31}$, 0, $H_{p2}$, $H_{p32}$, 0, 0, and $H_{p3}$ correspond to the parity part of the parent parity check matrix. In Equation 3, 0 denotes a zero matrix with all 0s. Every column of the partial matrix $H_{p3}$ has a weight of 1. A weight is defined as the number of non-zero values, for example, the number of 1s. The partial matrix $H_{p3}$ can be an identity matrix, for example. A parity check matrix having a column with a weight of 1 can increase the minimum distance of a code, thus improving performance. However, too many columns having a weight of 1 may cause error flooring. Hence, the number of columns with a weight of 1 is decided by density evolution analysis, for example, in order to achieve optimal performance.

In Equation 3, $[H_{p2}{}^t H_{p32}{}^t]^t$ is generated such that one column has a weight of 1 and all other columns have a weight of 2. Herein, t denotes transpose operation. For example, the partial matrix $H_{p2}$ is generated to have a dual diagonal structure and the partial matrix $H_{p32}$ is formed to be a zero matrix, as follows:

$$H_{p2} = \begin{bmatrix} 1 & 0 & 0 & \ldots & 0 \\ 1 & 1 & 0 & \ldots & 0 \\ 0 & \ldots & 0 & \ldots & 0 \\ 0 & 0 & \ldots & 1 & 1 \end{bmatrix} \quad \text{[Eqn. 4]}$$

$$H_{p32} = \begin{bmatrix} 0 & 0 & \ldots & 0 \\ 0 & 0 & \ldots & 0 \\ 0 & 0 & \ldots & 0 \end{bmatrix}.$$

Puncturing of bits corresponding to columns of the partial matrices $H_{p2}$ and $H_{p32}$ produces the block LDPC code with R2.

When the above-described puncturing is used, the following child parity check matrix can be generated by removing columns corresponding to the punctured bits and rows connected to the columns in the parent parity check matrix:

$$\lfloor H_1 \; H_{p11} \rfloor \quad \text{[Eqn. 5]}$$

To design a block LDPC code that ensures excellent performance for various code rates, the partial matrices $H_{p2}$ and $H_{p32}$ described in Equation 4 should have an optimum degree distribution, for example by density evolution analysis. The optimal degree distribution of the parent parity check matrix described as Equation 3 is detected based on the partial matrices described as Equation 4, for example by density evolution analysis.

Also, for generation of the block LDPC code with R2, a block LDPC code generated using the child parity check matrix described as Equation 5 is encoded again using the following parity check matrix:

$$\begin{bmatrix} H_2 & H_{p21} & H_{p2} & 0 \\ H_3 & H_{p31} & H_{p32} & H_{p3} \end{bmatrix}. \quad \text{[Eqn. 6]}$$

The parity check matrix of Equation 6 generated using the child parity check matrix is referred to as an 'additional child parity check matrix'. The code rate R3 of an LDPC code generated using the additional child parity check matrix is between R1 and R2. Especially when the partial matrices $H_{p2}$ and $H_{p32}$ are generated by Equation 4, the block LDPC code is easily generated using an accumulator.

The block LDPC code with R3 between R1 and R2 can be generated by puncturing parity bits corresponding to the partial matrices $H_{p2}$ and $H_{p3}$ or removing columns corresponding to the punctured parity bits and rows connected to the columns, thus reducing encoding and decoding complexity.

Figure 2:
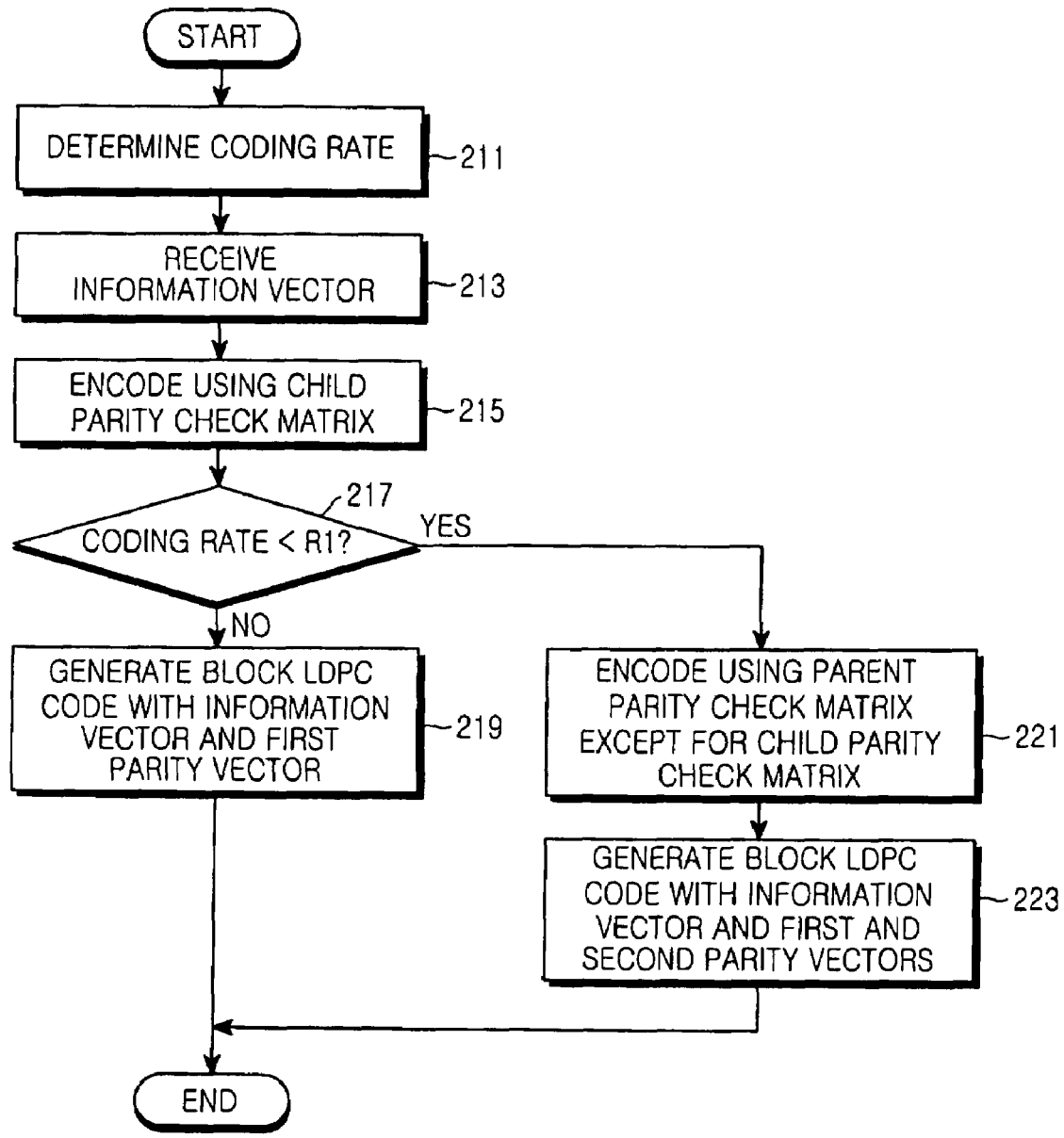
FIG. 2 is a flowchart of an operation for generating a block LDPC code according to an exemplary embodiment of the present invention.

With reference to FIG. 2, an operation for generating a block LDPC code according to an exemplary embodiment of the present invention will be described.

FIG. 2 is a flowchart of an operation for generating a block LDPC code according to an exemplary embodiment of the present invention.

Figure 3:
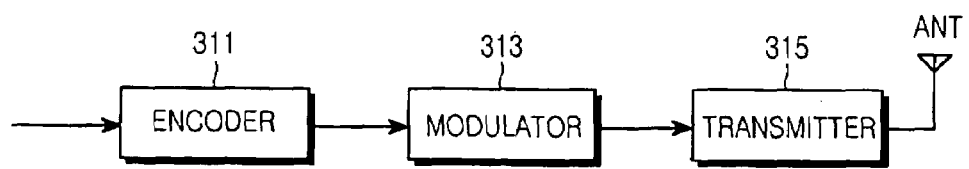
FIG. 3 is a block diagram of a signal transmission apparatus in a communication system using block LDPC codes according to an exemplary embodiment of the present invention.

Before describing FIG. 2, it is clarified that the block LDPC coding takes place in an encoder 311 illustrated in FIG. 3.

Referring to FIG. 2, the encoder 311 decides on a code rate in step 211 and receives an information vector in step 213. In step 215, the encoder 311 encodes the information vector using the child parity check matrix supporting R1 described as Equation 5. Let the information vector be denoted by s. Then a codeword resulting from encoding using the child parity check matrix, i.e., a block LDPC code with R1 includes the information vector s and a first parity vector p1.

In step 217, the encoder 311 compares the decided code rate with R1. If the code rate is not below R1, that is, the code rate is equal to R1, the encoder 311 generates the block LDPC code with the information vector s and the first parity vector p1 as a final block LDPC code in step 219.

On the other hand, if the code rate is lower than R1 in step 217, the encoder 311 encodes the block LDPC code with the information vector s and the first parity vector p1 using a parent parity check matrix from which the child parity check matrix is removed, i.e., an additional parity check matrix in step 221. The parent parity check matrix and the additional parity check matrix are given as Equation 3 and Equation 6, respectively. The block LDPC code resulting from encoding using the additional parity check matrix has the information vector s, the first parity vector p1, and a second parity vector p2. In step 223, the encoder 311 generates the block LDPC code including the information vector s, the first parity vector p1, and a second parity vector p2 as the final block LDPC code.

With reference to FIG. 3, a signal transmission apparatus in a communication system using block LDPC codes according to an exemplary embodiment of the present invention will be described below.

FIG. 3 is a block diagram of a signal transmission apparatus in a communication system using block LDPC codes according to an exemplary embodiment of the present invention.

Referring to FIG. 3, the signal transmission apparatus includes the encoder 311, a modulator 313, and a transmitter 315. Upon generation of information data to be transmitted, i.e., an information vector, the encoder 311 encodes the information vector in a coding scheme, thus producing a codeword vector, i.e., a block LDPC codeword. The coding scheme is LDPC coding, which has been described with reference to FIG. 2. The modulator 313 modulates the codeword vector in a modulation scheme and outputs a modulation vector. The transmitter 315 processes the modulation vector and transmits it to a signal reception apparatus through an antenna.

Figure 4:
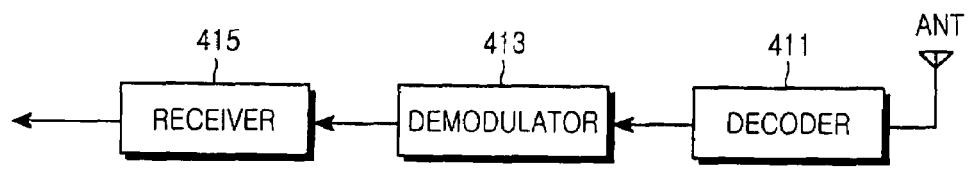
FIG. 4 is a block diagram of a signal reception apparatus in the communication system using block LDPC codes according to an exemplary embodiment of the present invention.

With reference to FIG. 4, a signal reception apparatus in the communication system using block LDPC codes according to an exemplary embodiment of the present invention will be described.

FIG. 4 is a block diagram of a signal reception apparatus in the communication system using block LDPC codes according to an exemplary embodiment of the present invention.

Referring to FIG. 4, the signal reception apparatus includes a receiver 411, a demodulator 413, and a decoder 415. The receiver 411 processes a signal received through an antenna from the signal transmission apparatus and provides the resulting reception vector to the demodulator 413. The demodulator 413 demodulates the reception vector in a demodulation scheme corresponding to the modulation scheme of the modulator 113 in the signal transmission apparatus. The decoder 415 decodes the demodulated vector received from the demodulator 413 in a decoding scheme corresponding to the coding scheme of the encoder 311 and outputs the decoded signal as a final recovered information vector. The decoding scheme (i.e., block LDPC decoding) can use a sum-product iterative decoding algorithm, for example.

As is apparent from the above description, the present invention advantageously enables signal transmission and reception at various code rates in a communication system using block LDPC codes. The support of various code rates increases the flexibility of block LDPC codes. Also, the present invention can support various code rates using a single CODEC, thereby minimizing the hardware complexity of the communication system using block LDPC codes.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for transmitting a signal in a signal transmission apparatus of a communication system, comprising:

generating a parity check matrix for a Low Density Parity Check (LDPC) code in accordance with a code rate to be used; and generating a codeword vector by encoding an information vector using the parity check matrix, wherein the parity check matrix generation comprises:

generating a first parity check matrix as the parity check matrix for the LDPC code, when the code rate is a first code rate; and generating a second parity check matrix supporting a second code rate lower than the first code rate by adding columns of a degree of 1 and columns of a degree of 2 to the first parity check matrix and generating the second parity check matrix as the parity check matrix for the LDPC code, when the code rate is the second code rate.

2. The method of claim 1, further comprising transmitting the codeword vector.

3. The method of claim 1, wherein the first parity check matrix is given as $[H_1 \ H_{p11}]$, where $H_1$ and $H_{p11}$ are partial matrices included in the first parity check matrix.

4. The method of claim 3, wherein the second parity check matrix is given as:

$$\begin{bmatrix} H_1 & H_{p11} & 0 & 0 \\ H_2 & H_{p21} & H_{p2} & 0 \\ H_3 & H_{p31} & H_{p32} & H_{p3} \end{bmatrix},$$

where $H_2$, $H_3$, $H_{p21}$, $H_{p31}$, 0, $H_{p2}$, $H_{p32}$, 0, 0, and $H_{p3}$ are partial matrices included in the second parity check matrix and 0 is a zero matrix.

5. The method of claim 4, wherein in the second parity check matrix, $[H_{p2}{}^t H_{p32}{}^t]^t$ is generated such that one column has a weight of 1 and all other columns have a weight of 2 and t denotes transpose operation.

6. The method of claim 4, wherein the partial matrix $H_{p2}$ has a dual diagonal structure and the partial matrix $H_{p32}$ is a zero matrix in the second parity check matrix.

7. A signal transmission apparatus in a communication system, comprising:
an encoder for generating a parity check matrix for a Low Density Parity Check (LDPC) code in accordance with a code rate to be used, and generating a codeword vector by encoding an information vector using the parity check matrix,
wherein the encoder generates a first parity check matrix as the parity check matrix for the LDPC code, when the code rate is a first code rate, and generates a second parity check matrix supporting a second code rate lower than the first code rate by adding columns of a degree of 1 and columns of a degree of 2 to the first parity check matrix and generates the second parity check matrix as the parity check matrix for the LDPC code, when the code rate is the second code rate.

8. The signal transmission apparatus of claim 7, further comprising a transmitter for transmitting the codeword vector.

9. The signal transmission apparatus of claim 7, wherein the first parity check matrix is given as $[H_1\ H_{p11}]$, where $H_1$ and $H_{p11}$ are partial matrices included in the first parity check matrix.

10. The signal transmission apparatus of claim 9, wherein the second parity check matrix is given as:

$$\begin{bmatrix} H_1 & H_{p11} & 0 & 0 \\ H_2 & H_{p21} & H_{p2} & 0 \\ H_3 & H_{p31} & H_{p32} & H_{p3} \end{bmatrix},$$

where $H_2$, $H_3$, $H_{p21}$, $H_{p31}$, 0, $H_{p2}$, $H_{p32}$, 0, 0, and $H_{p3}$ are partial matrices included in the second parity check matrix and 0 is a zero matrix.

11. The signal transmission apparatus of claim 10, wherein in the second parity check matrix, $[H_{p2}{}^t H_{p32}{}^t]^t$ is generated such that one column has a weight of 1 and all other columns have a weight of 2 and t denotes transpose operation.

12. The signal transmission apparatus of claim 10, wherein the partial matrix $H_{p2}$ has a dual diagonal structure and the partial matrix $H_{p32}$ is a zero matrix in the second parity check matrix.

13. A method for receiving a signal in a signal reception apparatus of a communication system, comprising:
generating a parity check matrix for a Low Density Parity Check (LDPC) code in accordance with a code rate used in a signal transmission apparatus corresponding to the signal reception apparatus; and
decoding a received codeword vector to an information vector using the parity check matrix,
wherein the parity check matrix generation comprises:
generating a first parity check matrix as the parity check matrix for the LDPC code, when the code rate is a first code rate; and
generating a second parity check matrix supporting a second code rate lower than the first code rate by adding columns of a degree of 1 and columns of a degree of 2 to the first parity check matrix and generating the second parity check matrix as the parity check matrix for the LDPC code, when the code rate is the second code rate.

14. The method of claim 13, further comprising receiving the codeword vector.

15. The method of claim 13, wherein the first parity check matrix is given as $[H_1\ H_{p11}]$, where $H_1$ and $H_{p11}$ are partial matrices included in the first parity check matrix.

16. The method of claim 15, wherein the second parity check matrix is given as:

$$\begin{bmatrix} H_1 & H_{p11} & 0 & 0 \\ H_2 & H_{p21} & H_{p2} & 0 \\ H_3 & H_{p31} & H_{p32} & H_{p3} \end{bmatrix},$$

where $H_2$, $H_3$, $H_{p21}$, $H_{p31}$, 0, $H_{p2}$, $H_{p32}$, 0, 0, and $H_{p3}$ are partial matrices included in the second parity check matrix and 0 is a zero matrix.

17. The method of claim 16, wherein in the second parity check matrix, $[H_{p2}{}^t H_{p32}{}^t]^t$ is generated such that one column has a weight of 1 and all other columns have a weight of 2 and t denotes transpose operation.

18. The method of claim 16, wherein the partial matrix $H_{p2}$ has a dual diagonal structure and the partial matrix $H_{p32}$ is a zero matrix in the second parity check matrix.

19. A signal reception apparatus in a communication system, comprising:
a decoder for generating a parity check matrix for a Low Density Parity Check (LDPC) code in accordance with a code rate used in a signal transmission apparatus corresponding to the signal reception apparatus, and decoding a received codeword vector to an information vector using the parity check matrix,
wherein the decoder generates a first parity check matrix as the parity check matrix for the LDPC code, when the code rate is a first code rate, and generates a second parity check matrix supporting a second code rate lower than the first code rate by adding columns of a degree of 1 and columns of a degree of 2 to the first parity check matrix and generates the second parity check matrix as the parity check matrix for the LDPC code, when the code rate is the second code rate.

20. The signal reception apparatus of claim 19, further comprising a receiver for receiving the codeword vector.

21. The signal reception apparatus of claim 19, wherein the first parity check matrix is given as $[H_1\ H_{p11}]$, where $H_1$ and $H_{p11}$ are partial matrices included in the first parity check matrix.

22. The signal reception apparatus of claim 21, wherein the second parity check matrix is given as:

$$\begin{bmatrix} H_1 & H_{p11} & 0 & 0 \\ H_2 & H_{p21} & H_{p2} & 0 \\ H_3 & H_{p31} & H_{p32} & H_{p3} \end{bmatrix},$$

where $H_2$, $H_3$, $H_{p21}$, $H_{p31}$, 0, $H_{p2}$, $H_{p32}$, 0, 0, and $H_{p3}$ are partial matrices included in the second parity check matrix and 0 is a zero matrix.

23. The signal reception apparatus of claim 22, wherein in the second parity check matrix, $[H_{p2}{}^t H_{p32}{}^t]^t$ is generated such that one column has a weight of 1 and all other columns have a weight of 2 and t denotes transpose operation.

24. The signal reception apparatus of claim 22, wherein the partial matrix $H_{p2}$ has a dual diagonal structure and the partial matrix $H_{p32}$ is a zero matrix in the second parity check matrix.

* * * * *